US009515201B2

(12) United States Patent
Lee

(10) Patent No.: US 9,515,201 B2
(45) Date of Patent: Dec. 6, 2016

(54) SOLAR CELL MODULE INCLUDING TRANSPARENT CONDUCTIVE FILM WITH UNIFORM THICKNESS

(71) Applicant: TES, Co., Ltd., Yongin, Gyeonggi-Do (KR)

(72) Inventor: Hong-Jae Lee, Gyeonggi-Do (KR)

(73) Assignee: TES Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/707,795

(22) Filed: May 8, 2015

(65) Prior Publication Data

US 2015/0243834 A1 Aug. 27, 2015

Related U.S. Application Data

(63) Continuation of application No. PCT/KR2014/006572, filed on Jul. 18, 2014.

(30) Foreign Application Priority Data

Sep. 26, 2013 (KR) ........................ 10-2013-0114273

(51) Int. Cl.
| | | |
|---|---|---|
| H01L 31/18 | (2006.01) | |
| H01L 31/20 | (2006.01) | |
| H01L 31/0216 | (2014.01) | |
| H01L 31/0224 | (2006.01) | |
| H01L 31/072 | (2012.01) | |

(Continued)

(52) U.S. Cl.
CPC ... *H01L 31/02168* (2013.01); *H01L 21/02532* (2013.01); *H01L 21/02697* (2013.01); *H01L 21/268* (2013.01); *H01L 21/2633* (2013.01); *H01L 31/022425* (2013.01); *H01L 31/072* (2013.01); *H01L 31/0725* (2013.01); *H01L 31/0747* (2013.01); *H01L 31/18* (2013.01); *H01L 31/1884* (2013.01); *H01L 31/1888* (2013.01); *H01L 31/202* (2013.01);
(Continued)

(58) Field of Classification Search
CPC .................................................. H01L 31/1888
See application file for complete search history.

(56) References Cited

U.S. PATENT DOCUMENTS

| | | | |
|---|---|---|---|
| 2011/0306163 A1* | 12/2011 | Song .................. | H01L 31/02242 438/87 |
| 2012/0015471 A1* | 1/2012 | Wang ...................... | H01L 31/18 438/73 |
| 2012/0327499 A1* | 12/2012 | Parker ............... | B32B 17/10055 359/275 |

FOREIGN PATENT DOCUMENTS

| | | |
|---|---|---|
| JP | 2002-319692 A | 10/2002 |
| KR | 10-0847741 B1 | 7/2008 |
| KR | 10-2010-0053050 A | 5/2010 |

* cited by examiner

*Primary Examiner* — Victor A Mandala
*Assistant Examiner* — Regan J Rundio
(74) *Attorney, Agent, or Firm* — Mintz Levin Cohn Ferris Glovsky and Popeo, P.C.; Kongsik Kim; Colleen H. Witherell

(57) ABSTRACT

Provided is a solar cell module comprising a crystalline silicon wafer, at least one amorphous silicon layer provided on at least one of a top and bottom of the crystalline silicon wafer, a transparent conductive film provided on a surface of the at least one amorphous silicon layer, electrodes provided on a surface of the transparent conductive film and a division unit to divide the transparent conductive film into a current-carrying region and a non-current-carrying region, wherein the current-carrying region is electrically connected to the electrodes and the non-current-carrying region is electrically disconnected from the electrodes.

2 Claims, 11 Drawing Sheets

(51) Int. Cl.
*H01L 31/0725* (2012.01)
*H01L 21/20* (2006.01)
*H01L 21/268* (2006.01)
*H01L 21/263* (2006.01)
*H01L 21/02* (2006.01)
*H01L 31/0747* (2012.01)
*H01L 31/0236* (2006.01)

(52) U.S. Cl.
CPC ....... *H01L 31/022466* (2013.01); *Y02E 10/50* (2013.01); *Y02P 70/521* (2015.11)

SOLAR CELL MODULE INCLUDING TRANSPARENT CONDUCTIVE FILM WITH UNIFORM THICKNESS

CROSS-REFERENCE TO RELATED APPLICATION

This application is a continuation of International Application No. PCT/KR2014/006572 filed on Jul. 18, 2014, which claims priority to Korean Application No. 10-2013-0114273 filed on Sep. 26, 2013. The applications are incorporated herein by reference.

TECHNICAL FIELD

One or more aspects of the present invention relate to a solar cell module, and more particularly to, a solar cell module in which a transparent conductive film formed on a surface of the solar cell module and connected to electrodes has a uniform thickness to prevent a decrease in an open-circuit voltage, thereby increasing a fill factor.

BACKGROUND ART

With a sharp increase in the demand for electric power, much attention has recently been paid to generating electric power from renewable energy such as solar light, bio-energy, wind power, geothermal heat, marine resources, waste energy, etc., in addition to the existing fossil fuels such as coal, oil, etc. Research has been actively conducted on solar cells that convert solar energy into electric energy among renewable energy resources. In a solar light generation system using a solar cell, mechanical and chemical actions do not occur during conversion of solar energy into electric energy. Thus, the solar light generation system has a simple structure and thus hardly requires maintenance. When the solar light generation system is installed, the system has a long lifetime and is safe and echo-friendly.

A solar cell includes a cell on which solar light is incident, and generates electric power using the characteristics of the cell that generates electric power by a photoelectric effect when solar light is incident thereon. Recently, research has been actively conducted to increase the efficiency of generating electric power using a solar cell. For example, research has been actively conducted to decrease the reflectivity of solar light to be incident on a cell or increase an incidence rate of solar light incident on cells when the cells have the same size. However, when the thickness of an anti-reflection film formed on a surface of the cell is not uniform, an open-circuit voltage decreases and thus a fill factor decreases. Accordingly, there is a need to develop a technique of solving the problems.

SUMMARY

One or more embodiments of the present invention include a solar cell module of a solar cell, on which a transparent conductive film is formed to a uniform thickness so as to prevent an open-circuit voltage of the solar cell module from decreasing, thereby increasing a fill factor.

To achieve these objects, an embodiment of the present invention provides a solar cell module comprising, a crystalline silicon wafer, at least one amorphous silicon layer provided on at least one of a top and bottom of the crystalline silicon wafer, a transparent conductive film provided on a surface of the at least one amorphous silicon layer, electrodes provided on a surface of the transparent conductive film and a division unit to divide the transparent conductive film into a current-carrying region and a non-current-carrying region, wherein the current-carrying region is electrically connected to the electrodes and the non-current-carrying region is electrically disconnected from the electrodes.

The transparent conductive film has a uniform thickness in the current-carrying region. The electrodes are provided on a surface of the current-carrying region to be electrically connected to the current-carrying region.

The division unit comprises a groove provided along an edge of the transparent conductive film. The groove is formed in a V-shape by laser cutting. A depth of the groove is equal to or greater than a thickness of the transparent conductive film.

According to aforementioned present invention, a transparent conductive film formed on a surface of a solar cell module may be divided into a current-carrying region in which the transparent conductive film has a uniform thickness and a non-current-carrying region in which the transparent conductive film has a non-uniform thickness, and the current-carrying region may be electrically connected to electrodes, thereby preventing a decrease in an open-circuit voltage and a fill factor.

DETAILED DESCRIPTION

Hereinafter, exemplary embodiments of the present invention will be described in detail with reference to the accompanying drawings. The present invention may, however, be embodied in many different forms and should not be construed as limited to the embodiments set forth herein. Rather, these embodiments are provided so that this disclosure will be thorough and complete, and fully convey the scope of the invention to those skilled in the art. Throughout the specification, the same reference numbers may be used to denote similar components in various embodiments.

Figure 1:
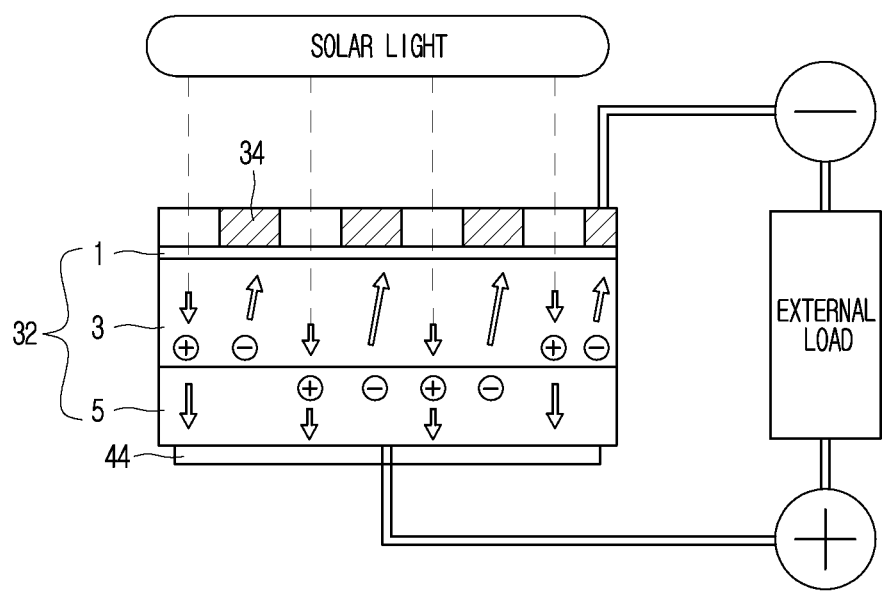
FIG. 1 is a diagram schematically illustrating operating principles of a solar cell according to the related art.

FIG. 1 is a diagram schematically illustrating a solar cell module according to the related art that is included in a solar cell to receive solar light and generate electric power. FIG. 1 is a side cross-sectional view of the solar cell.

Referring to FIG. 1, a solar cell may be defined as a battery that generates electric power by a photoelectric effect when solar light is incident thereon. As illustrated in FIG. 1, when solar light is incident on a cell 32 formed through a PN junction obtained when an N layer 3 and a P layer 5 are combined together, electron hole pair is formed. In this case, electrons move to the N layer 3 and holes move to the P layer 5 due to an electric field formed at the PN junction. Thus, an electromotive force is generated between the P layer 5 and the N layer 3, and electric current flows through the solar cell when a load is connected to electrodes 34 and 44. In FIG. 1, reference numeral '1' denotes an anti-reflection film that prevents solar light from being reflected.

However, in the solar cell, an efficiency of generating electric power using the cell 32 decreases when an operating temperature of the solar cell increases. To solve this problem, heterojunction solar cells as illustrated in FIGS. 2 and 3 have been introduced.

Figure 2:
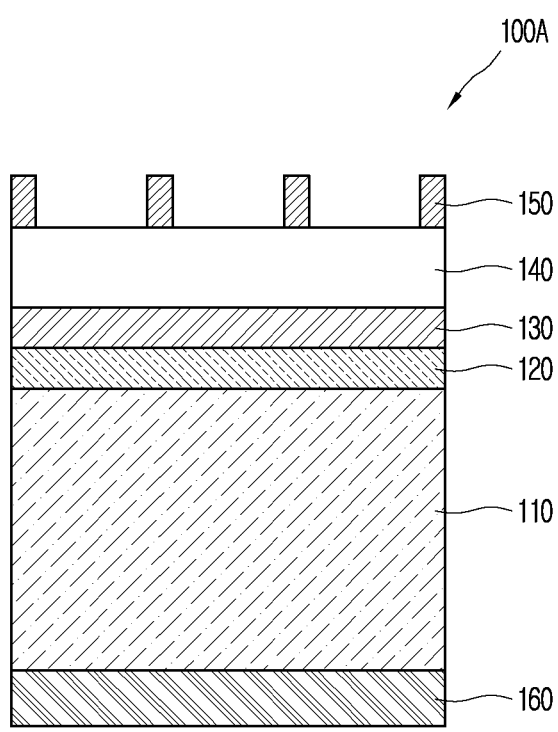
FIGS. 2 and 3 are cross-sectional views of solar cell modules with an amorphous silicon layer according to exemplary embodiments of the present invention.
Figure 3:
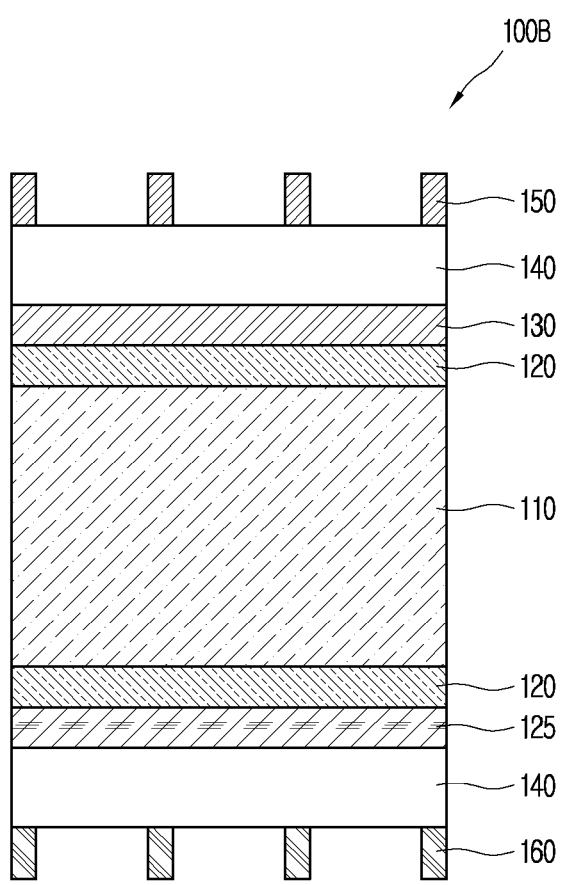

Referring to FIGS. 2 and 3, heterojunction solar cells are classified according to the properties of an N layer and a P layer. In detail, in the heterojunction solar cells of FIGS. 2 and 3, an N layer and a P layer have different crystal structures or are formed of different materials.

In the heterojunction solar cell of FIG. 2, a solar cell module 100A that generates electric power may include a crystalline silicon wafer 110, at least one amorphous silicon layer, e.g., amorphous silicon layers 120 and 130, which is formed on at least one of the top or bottom of the crystalline silicon wafer 110, a transparent conductive film 140 formed on a surface of the amorphous silicon layer 130 and upper electrodes 150 formed on a surface of the transparent conductive film 140. Here, the crystalline silicon wafer 110, the amorphous silicon layers 120 and 130, and the transparent conductive film 140 may be defined together as a solar cell.

The crystalline silicon wafer 110 may be formed of n type silicon. The intrinsic amorphous silicon layer 120 is formed on the crystalline silicon wafer 110, and the P type amorphous silicon layer 130 is deposited on the intrinsic amorphous silicon layer 120 using a deposition apparatus. The transparent conductive film 140, on which solar light is incident, is formed on the P type amorphous silicon layer 130. The upper electrodes 150 are formed on the transparent conductive film 140 to be spaced apart from each other in parallel. A lower electrode 160 is formed on a bottom surface of the crystalline silicon wafer 110.

The solar cell module 100A of FIG. 2 has substantially the same structure as the 'Heterojunction-with-Intrinsic Thin-film (HIT) solar cell' developed by Sanyo and placed on the market. In the solar cell module 100A, the intrinsic amorphous silicon layer 120 with a thickness of several nanometers is formed between the N type silicon wafer 110 and the P type amorphous silicon layer 130. Thus, the photoelectric conversion efficiency of the solar cell module 100A is higher by 20% or more than that of the solar cell module of FIG. 1 according to the related art.

FIG. 3 illustrates a solar cell module 100B having substantially the similar structure as the solar cell module 100A of FIG. 2, except for a texturing structure and an electric field forming layer 125.

In the heterojunction solar cell 100B of FIG. 3, a transparent conductive film 140 on which solar light is incident functions as an anti-reflection film that causes solar light to be incident on the solar cell without being reflected. In this case, a junction of the layers of the solar cell module 100B is formed of amorphous silicon and is thus limited in terms of process temperature. Thus, a silicon nitride-based anti-reflection film and a silver paste electrode employed in the solar cell module of FIG. 1 are not available and thus, for example, the indium tin oxide-based transparent conductive film 140 is used as an anti-reflection film.

In a solar cell, mechanical and chemical actions do not occur during conversion of solar energy into electric energy. Thus, the solar cell has a simple system structure and hardly requires maintenance. When a solar light system is installed, the system has a long lifetime and is safe and echo-friendly. However, initial installation costs of the solar cell are high. In particular, increasing the size of a silicon wafer to broaden the area of incidence of solar light is a major factor that increases the initial installation costs of the solar cell. To solve the problems, a solar cell as shown in FIG. 4 which includes a light collecting device that focuses solar light on a solar cell module has been introduced.

Figure 4:
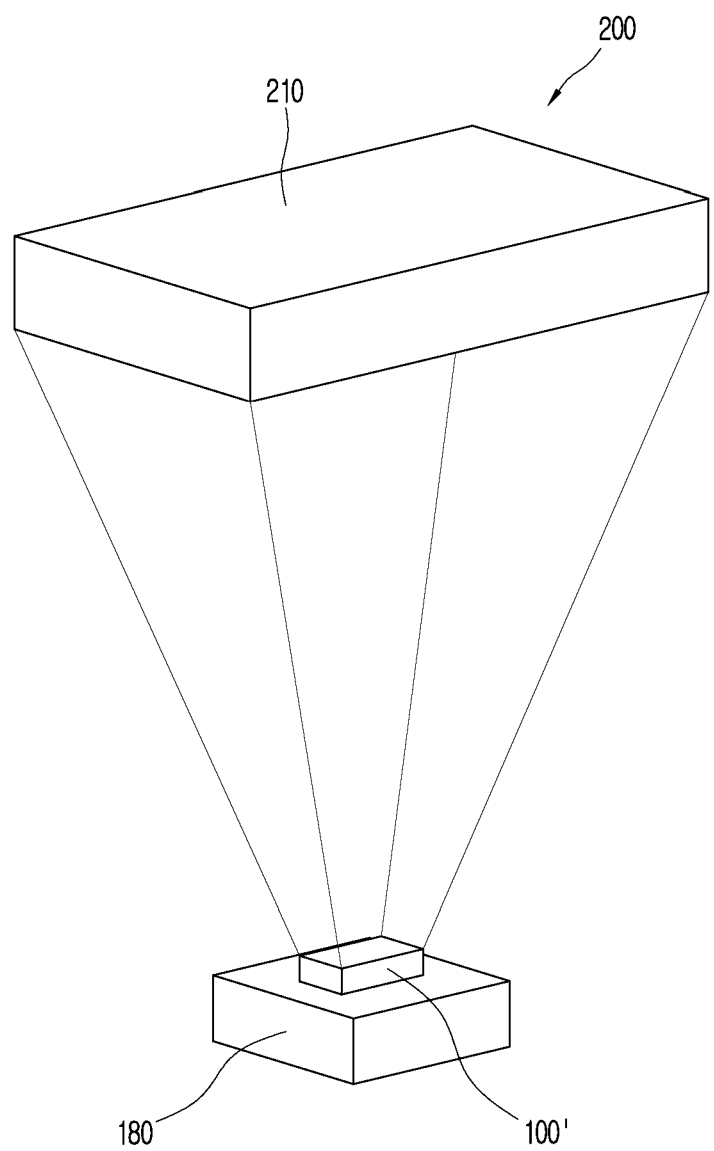
FIG. 4 is diagram schematically illustrating a solar cell with a condenser that focuses light on a solar cell module according to an exemplary embodiment of the present invention.

Referring to FIG. 4, in a solar cell 200, a solar cell module 100' is placed on a base 180, and a light collecting device, e.g., a condensing lens 210, is installed to be spaced a predetermined distance from the solar cell module 100'. The condensing lens 210 collects beams of solar light to be incident on the solar cell module 100' below the condensing lens 210. The distance between the solar cell module 100' and the condensing lens 210 may be appropriately determined according to a focal length of the condensing lens 210 such that most beams of the solar light passing through the condensing lens 210 are incident on the solar cell module 100'.

In the related art, a large-scale silicon wafer is required, whereas in the solar cell 200 according to an embodiment of the present invention, the condensing lens 210 is used to greatly decrease the size of a wafer, thereby lowering the initial installation costs of the solar cell 200.

A method of manufacturing a solar cell module by processing a wafer will be described below. In the following description, the term "wafer" may be defined as an assembly in which a transparent conductive film is omitted in a cell as described above, i.e., an assembly that has yet to be cut in a shape appropriate for a desired solar cell module.

Figure 5:
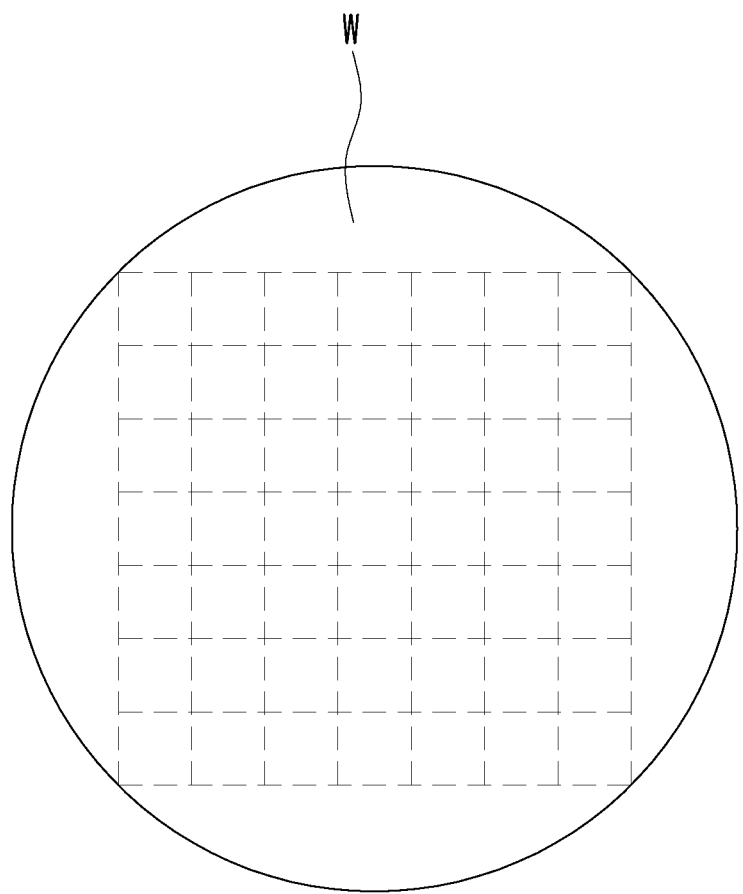
FIG. 5 is a plan view of a wafer on which cells of a solar cell module are gathered according to an exemplary embodiment of the present invention.

FIG. 5 illustrates a wafer W for forming an assembly in which a transparent conductive film is omitted in a cell as described above.

Referring to FIG. 5, the wafer W may have a round shape and may be cut along hidden lines according to a shape of a solar cell module. A transparent conductive film may be formed on a top surface and/or a bottom surface of the wafer W before the wafer W is cut according to the cross-sectional area of the solar cell module.

Figure 6:
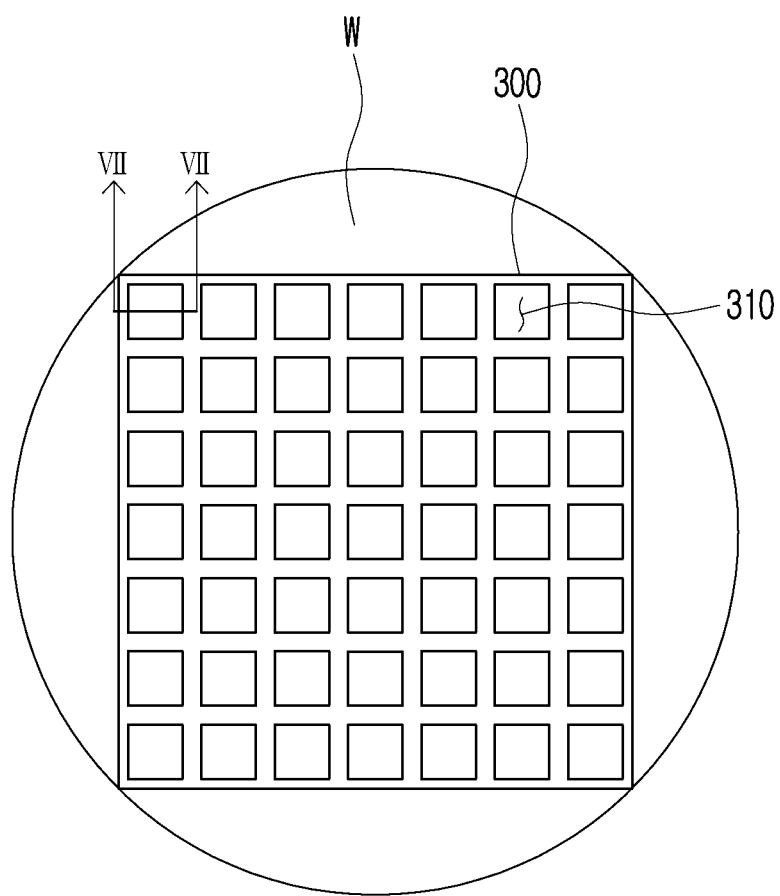
FIG. 6 is a plan view of a state in which a mask is placed on the wafer of FIG. 5.

FIG. 6 illustrates a state in which a mask 300 is placed on one surface (e.g., a top surface) of a wafer W to form a transparent conductive film.

As described above, the transparent conductive film is formed of an indium tin oxide-based material and is thus deposited on the wafer W by sputtering, etc. In this case, in order to deposit the transparent conductive film with the shape of a solar cell module, the mask 300 is placed on the wafer W. The mask 300 may include a plurality of openings 310 to deposit the transparent conductive film. That is, a film is deposited on the wafer W via the plurality of openings 310 to form the transparent conductive film.

Figure 7:
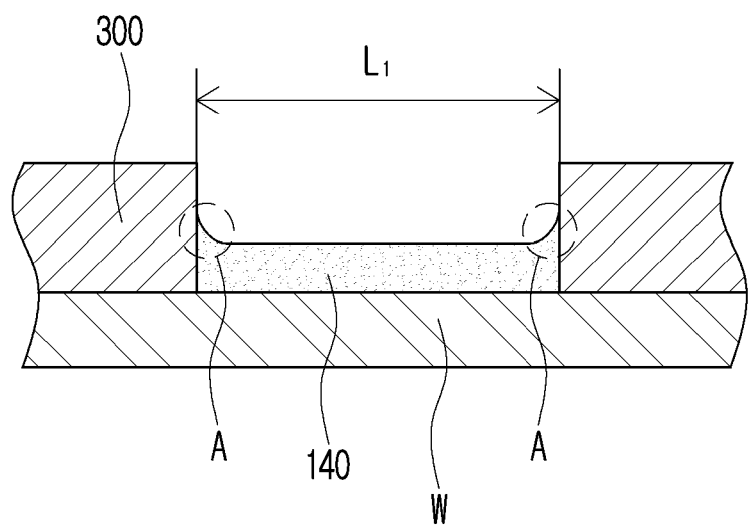
FIGS. 7 and 8 are cross-sectional views taken along line VII-VII of FIG. 6.
Figure 8:
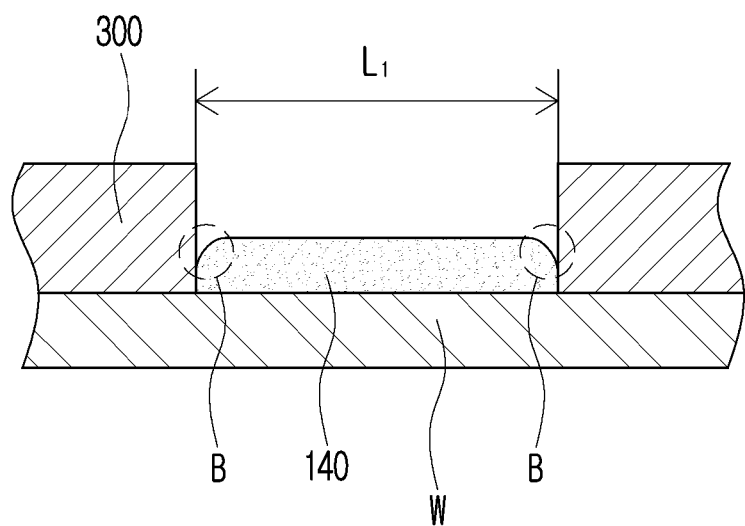

However, when a deposition process is performed as described above, the thickness of a deposited film may vary according to various causes. FIGS. 7 and 8 are cross-sectional views taken along line VII-VII of FIG. 6.

Referring to FIG. 7, if it is assumed that the width of a cross-sectional area of a solar cell module is '$L_1$', a transparent conductive film 140 is deposited on a wafer W via an opening in a mask 300. However, the transparent conductive film 140 may have a non-uniform thickness due to various causes during the deposition. As illustrated in FIG. 7, in an area A, the transparent conductive film 140 may become relatively thick along the edge of the opening in the mask 300. Otherwise, as illustrated in FIG. 8, in an area B, the transparent conductive film 140 may become relatively thin along the edge of the opening in the mask 300.

As described above, if a transparent conductive film has a non-uniform thickness and is relatively thick or thin in a region thereof, an open-circuit voltage may decrease and thus a fill factor may decrease when electric power is generated using an electrode. Thus, electric power may not be generated to a desired level in a solar cell. A method of forming a transparent conductive film to a uniform thickness according to an embodiment of the present invention will be described below.

Figure 9:
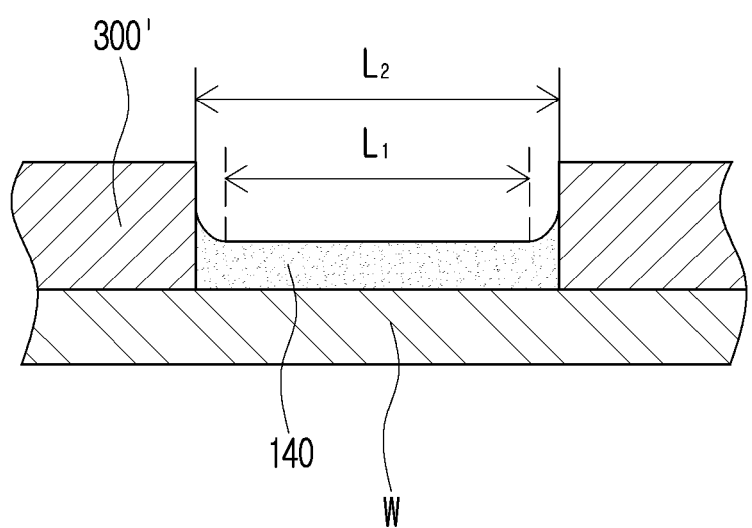
FIG. 9 is a cross-sectional view of a mask according to another exemplary embodiment of the present invention.

FIG. 9 is a side cross-sectional view of a process of forming a transparent conductive film 140 using a mask 300' according to another exemplary embodiment of the present invention.

Referring to FIG. 9, an opening of the mask 300' has a width $L_2$ longer than the widths $L_1$ of the openings in the masks 300 described above with reference to FIGS. 7 and 8. For example, the width '$L_2$' may be longer by about 10% to 15% than the width '$L_1$'. Here, the width '$L_1$' corresponds to the width of a solar cell module according to the related art. That is, in the present embodiment, the transparent conductive film 140 is formed to have a width (or an area) greater than the width (or an area) of the solar cell module according to the related art. Thus, as illustrated in FIG. 9, a portion of the transparent conductive film 140 corresponding to the width $L_1$ corresponding to the width of the solar cell module according to the related art may have a uniform thickness, and the thickness of the remaining portion thereof may be non-uniform. Accordingly, the transparent conductive film 140 may be electrically divided into a region S1 (see FIG. 10) in which the transparent conductive film 140 has a uniform thickness and a region S2 (see FIG. 10) in which the thickness of the transparent conductive film 140 is non-uniform. When electric power is supplied from the region S1 of the transparent conductive film 140, an open-circuit voltage and a fill factor may be prevented from decreasing.

Figure 10:
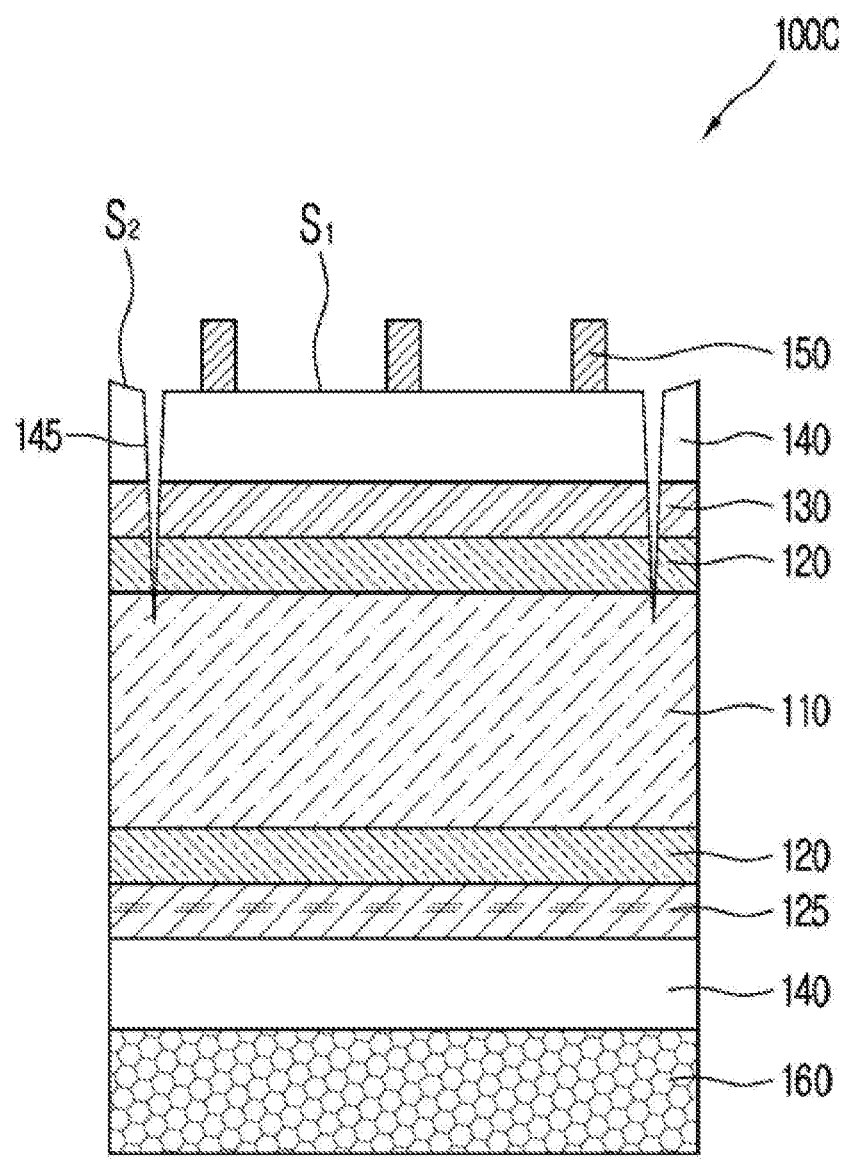
FIG. 10 is a side cross-sectional view of a solar cell module according to another exemplary embodiment of the present invention.
Figure 11:
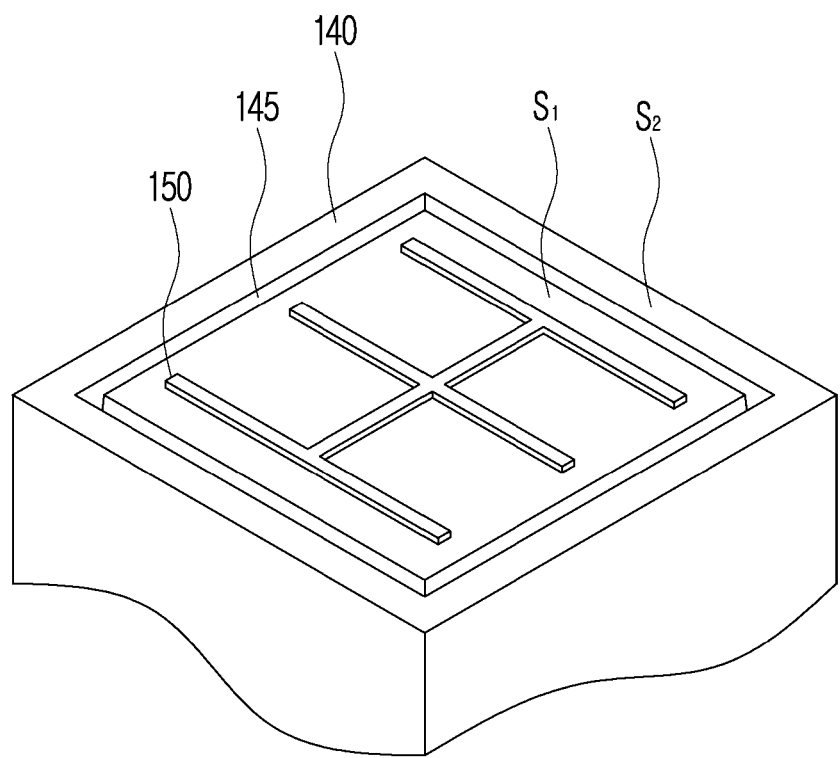
FIG. 11 is a plan view of FIG. 10.

FIGS. 10 and 11 illustrate a solar cell module 100C electrically divided into a region S1 in which a transparent conducive film 140 has a uniform thickness and a region S2 in which the transparent conductive film 14 has a non-uniform thickness as described above, according to another exemplary embodiment of the present invention. FIG. 10 is a side cross-sectional view of the solar cell module 100C. FIG. 11 is a perspective view of the solar cell module 100C.

Referring to FIGS. 10 and 11, the solar cell module 100C may include a crystalline silicon wafer 110, at least one amorphous silicon layer (e.g., amorphous silicon layers 120 and 130) formed on at least one of the top and bottom of the crystalline silicon wafer 110, the transparent conductive film 140 formed on a surface of the amorphous silicon layer 130, and electrodes 150 formed on a surface of the transparent conductive film 140. The solar cell module 100C may further include a division unit that divides the transparent conductive film 140 into a current-carrying region S1 electrically connected to the electrodes 150 and a non-current-carrying region S2 electrically disconnected from the electrodes 150.

Here, the current-carrying region S1 may be defined as a region in which the transparent conductive film 140 has a uniform thickness, and the non-current-carrying region S2 may be defined as a region in which the transparent conductive film 140 has a non-uniform thickness. The electrodes 150 may be formed in the current-carrying region S1, i.e., the region in which the transparent conductive film 140 has a uniform thickness, to be electrically connected to the current-carrying region S1. If the electrodes 150 are formed in the non-current-carrying region S2 to be electrically connected to the non-current-carrying region S2, an open-circuit voltage and a fill factor cannot be prevented from decreasing.

In detail, the division unit may be a groove 145 formed along an edge of the transparent conductive film 140. The groove 145 may be formed in various shapes but may be formed in a V-shape by laser cutting to form the solar cell module 100C in a small size and minimize damage to other elements due to the groove 145.

The groove 145 may be formed along the edge of the transparent conductive film 140. More specifically, the groove 145 may be formed along an edge of the current-carrying region S1 in which the transparent conductive film 140 has a uniform thickness. Thus, as illustrated in FIG. 11, the groove 145 may be formed along the edge of the transparent conductive film 140 and the electrodes 150 may be disposed inside the groove 145.

In this case, a depth of the groove 145 may be determined to be equal to or greater than the thickness of the transparent conductive film 140. When the depth of the groove 145 is less than the thickness of the transparent conductive film 140, the transparent conductive film 140 is difficult to be exactly divided into the current-carrying region S1 and the non-current-carrying region S2 by the groove 145. Although FIG. 10 illustrates that the groove 145 is formed to the silicon wafer 110 while passing through the transparent conductive film 140, exemplary embodiments of the present invention are not limited thereto. However, when the depth of the groove 145 is excessively high, for example, when the depth of the groove 145 is greater than a half of the thickness of the solar cell module, the mechanical reliability of the solar cell module 100C may be degraded. Accordingly, the depth of the groove 145 may be determined to be less than a half of the solar cell module 100C.

According to the one or more of the above embodiments, a transparent conductive film formed on a surface of a solar cell module may be divided into a current-carrying region in which the transparent conductive film has a uniform thickness and a non-current-carrying region in which the transparent conductive film has a non-uniform thickness, and the current-carrying region may be electrically connected to electrodes, thereby preventing a decrease in an open-circuit voltage and a fill factor.

Although the present invention has been described above with reference to the exemplary embodiments thereof, it would be understood by those skilled in the art that various changes and modifications may be made without departing from the technical conception and essential features of the present invention. Thus, it is clear that all modifications are included in the technical scope of the present invention as long as they include the components as claimed in the claims of the present invention.

The invention claimed is:

1. A method for manufacturing a solar cell module, comprising :
    depositing an amorphous silicon layer on at least one of a top and bottom of a crystalline silicon wafer;
    depositing a transparent conductive film on a surface of the amorphous silicon layer, the transparent conductive film comprising a current-carrying region having a uniform thickness and a non-current-carrying region having a non-uniform thickness, wherein the non-current-carrying region is provided along an edge of the current-carrying region and the thickness of the non-current-carrying region is relatively thicker or thinner than the thickness of current-carrying region;

depositing an electrode on a surface of the current-carrying region of the transparent conductive film; and forming a groove along a boundary between the current-carrying region and the non-current-carrying region, to divide the transparent conductive film into the current-carrying region and the non-current-carrying region.

2. The method for manufacturing a solar cell module according to claim 1, wherein a depth of the groove is equal to or greater than a thickness of the transparent conductive film.

* * * * *